United States Patent
Ogimoto et al.

(10) Patent No.: US 8,279,661 B2
(45) Date of Patent: Oct. 2, 2012

(54) MAGNETIC MEMORY ELEMENT, DRIVING METHOD FOR THE SAME, AND NONVOLATILE STORAGE DEVICE

(75) Inventors: Yasushi Ogimoto, Higashiyamato (JP); Haruo Kawakami, Miura (JP)

(73) Assignee: Fuji Electric Co., Ltd., Kawasaki-shi (JP)

( * ) Notice: Subject to any disclaimer, the term of this patent is extended or adjusted under 35 U.S.C. 154(b) by 214 days.

(21) Appl. No.: 12/734,292

(22) PCT Filed: Aug. 28, 2008

(86) PCT No.: PCT/JP2008/065410
§ 371 (c)(1),
(2), (4) Date: Jul. 12, 2010

(87) PCT Pub. No.: WO2009/078202
PCT Pub. Date: Jun. 25, 2009

(65) Prior Publication Data
US 2010/0284217 A1 Nov. 11, 2010

(30) Foreign Application Priority Data
Dec. 19, 2007 (JP) .................................. 2007-327175

(51) Int. Cl.
*G11C 11/00* (2006.01)
*G11C 11/14* (2006.01)
*G11C 11/15* (2006.01)

(52) U.S. Cl. .................... 365/158; 365/171; 365/173

(58) Field of Classification Search ............... 365/158, 365/171, 173
See application file for complete search history.

(56) References Cited

U.S. PATENT DOCUMENTS

| | | | | |
|---|---|---|---|---|
| 6,483,741 | B1 * | 11/2002 | Iwasaki et al. | 365/173 |
| 6,765,821 | B2 * | 7/2004 | Saito et al. | 365/158 |
| 6,967,863 | B2 * | 11/2005 | Huai | 365/158 |
| 7,313,013 | B2 * | 12/2007 | Sun et al. | 365/158 |
| 7,531,830 | B2 * | 5/2009 | Kaiser et al. | 365/173 |
| 7,894,245 | B2 * | 2/2011 | Sun et al. | 365/158 |
| 7,935,435 | B2 * | 5/2011 | Gao et al. | 365/173 |
| 7,936,598 | B2 * | 5/2011 | Zheng et al. | 365/173 |
| 8,085,582 | B2 * | 12/2011 | Nakamura et al. | 365/158 |

FOREIGN PATENT DOCUMENTS

| | | |
|---|---|---|
| JP | 2006-080287 A | 3/2006 |
| JP | 2006-128579 A | 5/2006 |
| JP | 2007-019179 A | 1/2007 |
| JP | 2007-150265 A | 6/2007 |

OTHER PUBLICATIONS

Jun Hayakawa et al, "Current-Induced Magnetization Switching in MgO Barrier Based Magnetic Tunnel Junctions with CoFeB/Ru/CoFeB Synthetic Ferrimagnetic Free Layer," Japanese Journal of Applied Physics, vol. 45, No. 40, 2006, pp. L1057-L1060.

David D. Djayaprawira et al, "230% Room-temperature Magnetoresistance in CoFeB/MgO/CoFeB Magnetic Tunnel Junctions," Applied Physics Letters 86, 092502 (2005).

* cited by examiner

*Primary Examiner* — Trong Phan
(74) *Attorney, Agent, or Firm* — Rabin & Berdo, P.C.

(57) ABSTRACT

A magnetic memory element (10) for use in a cross-point type memory is provided with a spin valve structure having a free layer (5), a nonmagnetic layer (4), and a pinned layer (3). The magnetic memory element is also provided with another nonmagnetic layer (6) on one surface of the free layer (5), and furthermore, a magnetic change layer (7) whose magnetic characteristics change depending on temperature so as to sandwich the nonmagnetic layer (6) with the free layer (5). In the magnetic change layer (7), the magnetization intensity increases depending on temperature.

20 Claims, 5 Drawing Sheets

MAGNETIC MEMORY ELEMENT, DRIVING METHOD FOR THE SAME, AND NONVOLATILE STORAGE DEVICE

This application is the national phase of international application number PCT/JP2008/065410, filed on Aug. 28, 2008, and claims the benefit of priority of Japanese application 2007-327175, filed Dec. 19, 2007. The disclosures of the international application and the Japanese priority application are incorporated herein by reference.

BACKGROUND OF THE INVENTION

This invention relates to a magnetic memory element capable of recording information by electrical means, to a driving method for such a magnetic memory element, and to a nonvolatile storage device.

BACKGROUND ART

In recent years the increase in capacity of nonvolatile semiconductor storage devices, of which flash memory is representative, has been remarkable, and there have been announcements of the release of products with capacities of approximately 32 Gbytes. In particular, the commodity value as USB memory and as storage for mobile phones is increasing, and among storage for portable music players also, the essential superiority of solid-state element memory with respect to vibration resistance, reliability, and low power consumption has been exploited, so that such devices are becoming the mainstream of storage for the above mobile or portable music or video commercial products.

Further, as an application other than in the above storage products, vigorous research is in progress to make the DRAM currently used as the main memory in information equipment nonvolatile, with the aim of realizing so-called "instant-on computers" which can be started instantaneously for use, and which have zero power consumption during standby. To this end, it is said that memory is required satisfying both (1) switching times of less than 50 ns and (2) overwrite operations exceeding $10^{16}$ cycles, as well as (3) nonvolatile properties, sought for DRAM used in main memory.

As candidates for such next-generation nonvolatile semiconductor storage devices, research and development are being conducted on ferroelectric memory (FeRAM), magnetic memory (MRAM), phase-change memory (PRAM), and nonvolatile memory elements based on various other principles; but it is thought that only MRAM satisfies the performance requirements described above to replace DRAM. However, the number of overwrite operations ($>10^{16}$) described above as a performance requirement assumes the number of accesses performed over ten years when overwriting every 30 ns, but in the case of memory with nonvolatile properties, a refresh cycle is unnecessary, so this many operations are not necessary. There are already examples of technology development in which MRAM performance has enabled $10^{12}$ or more overwrite operations, and switching times are also fast (<10 ns), so that compared with other candidate technologies for nonvolatile storage devices, feasibility is regarded as good.

The most serious problems when commercializing this MRAM are the size of the cell area and the high cost per bit (bit cost). Currently marketed MRAM products with a small capacity of approximately 4 Mbits are current-induced magnetic field write type devices, with cell areas of 20 to 30 $F^2$ (where F is the minimum process dimension of the manufacturing process) or greater, and the area per bit is too large. Hence for practical purposes, replacement of DRAM is difficult.

With this as background, two technology developments which may rank as breakthroughs have been achieved in the MRAM engineering field. One is MTJs (magnetic tunnel junctions) using an MgO tunnel insulating film, by which means magnetoresistances of 200% or higher are easily obtained (see D. D. Djayaprawira et al, "230% room-temperature magnetoresistance in CoFeB/MgO/CoFeB magnetic tunnel junctions," Applied Physics Letters, Vol. 86, 092502, 2005). The other is current-induced magnetization switching. This current-induced magnetization switching not only avoids the problem of an increase in the magnetic field (reversal magnetic field) required for overwriting (magnetization reversal) in minute cells, which was a critical defect of the current-induced magnetic field write method, but in fact is an write method having the advantage of reducing the write energy according to the scaling, that is, as the element is made finer the write energy is also reduced. By means of this current-induced magnetization switching method, a configuration is possible in which one MTJ is operated by one transistor (1T1MTJ configuration), so that ideally cell areas may be about 6 to 8 $F^2$, on a par with current DRAM (see J. Hayakawa et al, "Current-induced magnetization switching in MgO barrier based magnetic tunnel junctions with CoFeB/Ru/CoFeB synthetic ferrimagnetic free layer," Japanese Journal of Applied Physics, Vol. 45, No. 40, L1057-L1060, 2006).

However, even in these circumstances, the bit cost of MRAMs cannot easily surpass the bit cost of DRAMs when considering applications as main memory replacing current DRAM. This is because of the need to form a magnetic multilayer film and an extremely thin, uniform tunnel insulating film. Further, when considering the objective of application as storage also, MRAM cannot yet adequately compete with flash memory, which has such characteristics as a low bit cost and small cell area of approximately 4 $F^2$. Hence MRAM is faced with the problem that there is no prospect of applications which exploit its basic advantages, and development is not advancing.

Even if one of the technologies described above as a breakthrough, the current-induced magnetization switching method, is employed, in order to choose MTJs, that is, in order to perform addressing of a memory cell and overwrite to a target state, a transistor must be used for each memory cell. This problem arises from the fact that switching of the polarity of the current (the direction of current flow) is necessary for memory switching, so that the current switching circuit requires a transistor. Hence in a method of the prior art using the current-induced magnetization switching method, due to the nature of switching, it is difficult to fit a cell into an area of approximately 4 $F^2$, and this represents a large obstacle when raising the integration density.

This invention was devised in light of the above problems, and has as an object the resolution of at least some of the above problems.

SUMMARY OF THE INVENTION

The inventors of this application again studied the principles of the current-induced magnetization switching method, and studied the optimal memory element structure for applications in which memory cell area is reduced and methods for driving such elements. As a result, invention of a magnetic memory element described below, as well as of a method of driving such elements and a nonvolatile storage device, was achieved.

That is, in order to resolve the above problems, this invention provides a magnetic memory element, which has a spin valve structure comprising a free layer having a thickness defined by a first face and a second face and exhibiting ferromagnetism, a first nonmagnetic layer positioned with one face opposing the first face, and a pinned layer sandwiching the first nonmagnetic layer together with the free layer and exhibiting ferromagnetism, and in which the spin valve structure is caused to store information by applying an electric pulse, the magnetic memory element further comprising a second nonmagnetic layer positioned on the side of the second face of the free layer, and a magnetic change layer sandwiching the second nonmagnetic layer together with the free layer, and comprising a magnetic material the magnetic characteristics of which change according to temperature. Here, a spin valve structure is a structure comprising a ferromagnetic layer (pinned layer)/nonmagnetic layer/ferromagnetic layer (free layer); the pinned layer is configured such that the direction of the magnetization changes less readily than in the free layer. Notation in which a plurality of layers are delimited by a slash (/) indicates a configuration in which the plurality of layers described are layered in that order (from right to left), and similarly when what is described is a film composition.

In the magnetic material the magnetic characteristics of which change according to temperature, when the magnetic properties change according to temperature, the magnetic physical properties of the magnetic material change according to temperature. In this way, the magnetization of the free layer assumes different states at least two temperatures according to changes with temperature in the magnetic characteristics of the magnetic change layer. When the magnetization state of the free layer is caused to change further by utilizing this change in magnetization, switching can be performed even without using an external magnetic field.

For the pinned layer, similarly to when performing switching using a magnetic field, an antiferromagnetic layer is layered so as to be directly or indirectly in contact with the pinned layer, and the effect of the increased coercivity of the pinned layer based on the exchange coupling between these layers can be utilized. For example, when an external magnetic field of a certain magnitude is applied, the magnetization direction in the pinned layer does not change, but the fact that the angle made by the free layer magnetization direction relative to the pinned layer magnetization direction changes can be utilized. In this example, the structure of a magnetoresistance element, which utilizes the phenomenon in which the resistance value changes according to an external magnetic field (a phenomenon in which the resistance is lowest for parallel alignment, and is highest for antiparallel alignment) is obtained. Further, the nonmagnetic layer plays the role of cutting off the magnetic coupling between the ferromagnetic layers (pinned layer and free layer), and when the nonmagnetic layer is of metal, the element operates as a giant magnetoresistance (GMR) element, but when the nonmagnetic layer is an insulator the element acts as a tunneling magnetoresistance (TMR) element. However, when a current is used to perform switching as in the prior art, the pinned layer need not always have a high coercivity (Hc) or a high magnetic anisotropy (Ku); instead, a large saturation magnetization (Ms) and the absence of a tendency for spin precession movement to occur are important, and these points similarly obtain in this invention as well.

When a magnetic memory element having the above characteristics is operated, the rise in temperature of the spin valve structure due to electric pulse application, and the fact that due to this temperature increase, the magnetic characteristics of the magnetic change layer provided on the free layer sandwiching another nonmagnetic layer (second nonmagnetic layer), are utilized. Because the magnetization of this magnetic change layer causes a magnetic field and acts on the magnetization of the free layer, precession movement of the free layer magnetization, excitation of which is difficult merely by passing a current, can be induced, and reversal can easily be accomplished. Hence regardless of the magnetization direction in the pinned layer, the relative angle of the free layer magnetization can be switched between parallel and antiparallel.

This magnetic change layer can be made such that the magnetic characteristics change on the low-temperature side and on the high-temperature side of a certain temperature (a prescribed temperature), and such that this change is, for example, inversion of the apparent magnetic characteristics on the low-temperature side and on the high-temperature side with the prescribed temperature as the boundary, or magnetic characteristics which are manifested only on either the low-temperature side or on the high-temperature side. Such changes can be realized through the occurrence of some phase transition with this temperature as the boundary, or due to inversion across at the boundary of this temperature of the values of the difference or sum of the properties of two materials the properties of which change with temperature, without being accompanied by a phase transition, or due to some other arbitrary cause. As one example, a material can be used in which an anisotropy magnetic field occurs on the low-temperature side of, and is annihilated on the high-temperature side of, a certain temperature, or in which, conversely, an anisotropy magnetic field which is not seen on the low-temperature side is seen on the high-temperature side.

In a magnetic memory element having such characteristics, the change in the magnetic change layer occurring due to a rise in temperature is clear, and so the influence on the magnetization of the free layer is also clear, and consequently switching operation is stable.

A further characteristic of a magnetic memory element of this invention is that the resistance value of the second nonmagnetic layer is greater than the resistance value of the first nonmagnetic layer.

As a result of the above characteristics, heat generation of the second nonmagnetic layer is greater than heat generation of the first nonmagnetic layer, and the increase in temperature is greater in both the free layer which is the target, and in the magnetic change layer. As a result, free layer switching is possible at lower voltages and smaller currents.

In a magnetic memory element of this invention, a magnetic compensation temperature $T_{comp}$ which is the prescribed temperature is within an operation temperature range for operation of the magnetic memory element, and the magnetic change layer can comprise an N-type ferrimagnetic layer, which exhibits magnetization in a direction perpendicular to the layering face of the spin valve structure on the high-temperature side of the magnetic compensation temperature $T_{comp}$. At this time, the free layer can for example store information by means of in-plane magnetization.

As a result of the above characteristics, in the case of an element in which a state is maintained in which the pinned layer magnetization and the free layer magnetization are both in-plane and parallel-antiparallel switching is caused, as the application of electric pulses causes the temperature of the N-type ferromagnetic layer which is the magnetic change layer to rise from the magnetic compensation temperature $T_{comp}$, magnetization perpendicular to the film plane (perpendicular magnetization) occurs, and the magnetic field generated by this perpendicular magnetization acts on the free layer, so that precession movement of the free layer, which could not easily be excited by means of an ordinary current alone, can be easily achieved. That is, due to the temperature increase the perpendicular magnetization of the magnetization change layer causes a perpendicular magnetic field as leakage magnetic flux near the free layer, and by this means, free layer magnetization precession occurs. The free layer magnetization which undergoes precession in this way can easily be reversed. On the other hand, when there is no temperature increase due to electric pulses, leakage magnetic flux is not generated from the magnetic change layer, and so the storage state of the free layer is stably preserved. In this configuration, when a balance is struck such that the pinned layer configuration is made a configuration which enables magnetization reversal in the free layer while stabilizing storage, even when the configuration is such that storage is made more stable, the necessary reversal operation can be performed through the assistance of the magnetic change layer. Hence a pinned layer configuration can be adopted which makes the free layer storage state still more stable, and data retention characteristics can be improved. In this invention, a description of an operation temperature for operating a magnetic memory element is used; this means the temperature when a manufactured memory element is actually used, and is made lower than the temperature of the memory element in circumstances in which the memory element temperature is intentionally increased by the intentional application of electric pulses, including the temperature of a magnetic memory element used in an environment in which the temperature is higher than room temperature due to the temperature within the electronic equipment and the influence of the actual operating state, and in a case in which a magnetic memory element is for example a portion of a storage device and used in equipment, including temperatures from the temperature immediately after startup when the equipment is started from the stopped state, to the temperature at the time of stoppage after overheating. To indicate such a temperature range, a temperature range during operation of, or to ensure functions during storing of, a storage device in which the magnetic memory element is used, may for example have a lower-limit temperature of any among −40° C., −30° C., −25° C., −20° C., −10° C., or similar, an upper-limit temperature of 60° C., 80° C., 85° C., 100° C., 120° C., or similar, and a temperature range obtained by an arbitrary combination of these can be employed. The above characteristics are selected with for example these temperature ranges selected as the temperature when the memory element is actually used, and indicate that the magnetic compensation temperature $T_{comp}$ is within the temperature range. When the temperature is intentionally raised by means of electric pulses, the temperature of the magnetic change layer of the memory element may locally be approximately 250° C., and when the magnetic change layer is an N-type ferrimagnetic layer, the magnetic characteristics of the magnetic change layer can be made to change sufficiently.

As the material for such a magnetic change layer, an amorphous alloy material of a rare earth and a transition metal can be used. In particular, TbFeCo and GdFeCo and similar are preferable. Such amorphous materials are also preferable from the standpoint of process matching when manufacturing a layered structure of a magnetic multilayer film with different crystal structures. This is because when for example MgO is used to fabricate the tunnel insulating film, the amorphous metal material (for example CoFeB) used to sandwich this tunnel insulating film is amorphous at the time of deposition, and upon annealing after element manufacture, crystallization advances from the MgO interface. From this standpoint, an amorphous alloy of a rare earth and a transition metal is also more preferable from the standpoint that there are no impediments to manufacture of a conventional element structure.

Further, in a magnetic memory element of this invention, the magnetic compensation temperature $T_{comp}$, which is a prescribed temperature, is a temperature higher than an operation temperature range for operation of the magnetic memory element, and the magnetic change layer can comprise an N-type ferrimagnetic layer which exhibits magnetization in opposite directions on the low-temperature side and on the high-temperature side of the magnetic compensation temperature $T_{comp}$. In this case, the magnetic field created in the free layer by the N-type ferrimagnetic layer can be a magnetic field in a direction perpendicular to the film plane, and the free layer can be magnetized within the film plane to store data. The temperature range of the above characteristic is similar to that described previously.

As a result of the above characteristics, through application of electric pulses the temperature of the N-type ferrimagnetic layer which is the magnetic change layer rises, and upon passing the magnetic compensation temperature $T_{comp}$ the perpendicular magnetization of the magnetic change layer is reversed, and the reversed magnetic field acts on the free layer. Hence precession movement of the free layer can be easily achieved. In this case also, by raising the temperature of the magnetic change layer from the various operation temperature ranges described above by means of electric pulses, the magnetization of the magnetic change layer can be put into the opposite direction.

Further, a magnetic memory element of this invention can further comprise a current-constricting structure which limits the region of passage of a current flowing in the free layer.

As a result of the above characteristics, the temperature near the current-constricting structure rises, so that the temperature of the magnetic change layer can easily be raised. The current-constricting structure raises the temperature from the corresponding region of the magnetic change layer, so that an increase in temperature occurs rapidly in a narrow region, and when the free layer magnetization is reversed also, the leakage magnetic field into the free layer region corresponding to the current-constricting region is increased, resulting in circumstances in which reversal occurs more readily in this portion. Rather than causing reversal uniformly over the entire region of the free layer, causing reversal in a portion, and exerting this influence on the entire region of the free layer in the memory cell, causes the threshold value for reversal to be lowered, so that stable switching can be performed; moreover, the storage stability is affected not by the size of the region through which the current flows, but the size of the region of the free layer in the memory cell, so that even when storage stability is enhanced, the current-constricting structure can be prevented from affecting switching.

Further, in order to resolve the above problems, in a magnetic memory element of this invention, the magnetic change layer can comprise a magnetic material the magnetization of which increases, and the magnetization direction of which becomes oblique according to the temperature. As one example of such a magnetic layer, a rare earth-transition metal amorphous alloy which is an N-type ferrimagnetic material, and more specifically, GdFeCo, is desirable. As explained below, this is because the magnetic compensation temperature is substantially room temperature, and the temperature dependence is such that as the temperature rises, first the perpendicular magnetization component, and then the in-plane magnetization component increases, and thereafter the perpendicular magnetization component again increases, after which, in approaching Tc, the total magnetization declines. Here, a spin valve structure is a structure comprising a ferromagnetic layer (pinned layer)/nonmagnetic layer/ferromagnetic layer (free layer); the pinned layer is made such that the magnetization direction does not change as readily as in the free layer. In the case of switching by means of a magnetic field, methods to raise the coercivity through the exchange coupling between the pinned layer and an antiferromagnetic layer and similar are widely used. For example, when an external magnetic field of a certain magnitude is applied, the magnetization direction of the pinned layer does not change, and the made by the free layer magnetization direction with the pinned layer magnetization direction changes. This is the structure of a magnetoresistance element which utilizes the phenomenon in which the resistance value changes corresponding to this (the phenomenon in which the resistance is lowest for parallel alignment, and the resistance is highest for antiparallel alignment). Further, the nonmagnetic layer plays the role of cutting off the magnetic coupling between the ferromagnetic layers (pinned layer and free layer), and when a metal is used, the element operates as a giant magnetoresistance (GMR) element, but when an insulator is used the element acts as a tunneling magnetoresistance (TMR) element.

As a result of a magnetic memory element configuration with the above characteristics, magnetization reversal of the free layer by means of single-polarity electric pulses with different pulse heights becomes possible, so that parallel/antiparallel switching of the magnetization alignment is possible. Hence a rectifying element (diode) can be connected in series as a memory cell selection element, and cross-point type memory with a minimum cell area of 4 $F^2$ is realized.

Further, in a magnetic memory element of this invention, the in-plane magnetization component of the magnetic change layer can be made to be parallel to the pinned layer magnetization direction. Also, in a magnetic memory element of this invention, the in-plane magnetization component of the magnetic change layer can be made antiparallel to the pinned layer magnetization direction.

As a result of a configuration with the above characteristics, operation in which the free layer magnetization is switched to be parallel to, or antiparallel to, the pinned layer magnetization by means of the spin precession method described below can be performed more stably.

Further, this invention provides a method of driving a magnetic memory element, having a spin valve structure comprising a free layer having a thickness defined by a first face and a second face and exhibiting ferromagnetism, a first nonmagnetic layer positioned with one face opposing the first face, and a pinned layer sandwiching the first nonmagnetic layer together with the free layer and exhibiting ferromagnetism, and which further comprises a second nonmagnetic layer positioned on the side of the second face of the free layer, and a magnetic change layer sandwiching the second nonmagnetic layer together with the free layer, and comprising a magnetic material the magnetic characteristics of which change according to temperature; the driving method comprises a recording step of applying an electric pulse, which is a single-polarity pulse, to the spin valve structure, and recording information in the spin valve structure.

As a result of a configuration with the above characteristics, only single-polarity electric pulses are used, and so a rectifying element can be used as a cell selection switch. As a result, a memory element with minimum cell dimensions of 4 $F^2$ can be realized.

Also, a step can further be included in which the amplitude of the single-polarity electric pulse in the rising interval is made greater than the averaged value across the entire pulse width of the amplitude of the single-polarity electric pulse.

As a result of a configuration with the above characteristics, the temperature of the magnetic change layer can be raised rapidly when electric pulses are applied, and precession movement of the free layer can be achieved rapidly.

Further, a magnetic memory element driving method of this invention can further comprise a step of controlling the pulse width of the single-polarity electric pulse, and by means of the single-polarity electric pulse having a controlled pulse width, the magnetization of the free layer of the spin valve element can be controlled, so that the information can be recorded as a combination of directions of the magnetization of the free layer and the magnetization of the pinned layer (called the "magnetization alignment").

As a result of a configuration with the above characteristics, by applying an electric pulse with the width of half the period of the free layer precession (that is, the switching time $\tau$ from parallel to antiparallel, or from antiparallel to parallel), switching can be performed. Further, switching can also be performed using a pulse with an odd multiple of this period.

Further, a magnetic memory element driving method of this invention further comprises a step of controlling the number of the single-polarity electric pulses; the magnetization of the free layer of the spin valve element can be controlled through the number of single-polarity electric pulses having a prescribed pulse width, and the information can be recorded as a combination of directions of the magnetization of the free layer and the magnetization of the pinned layer.

As a result of a configuration with the above characteristics, when the magnetization direction of the free layer is to be modified so as to modify the magnetization alignment, an odd number of pulses having the above pulse width $\tau$ are applied, and when no modification is to be made, an even number of pulses are applied, so that recording of the desired digital data is possible.

Further, in a magnetic memory element driving method of this invention, the polarity of the single-polarity electric pulse can be made a polarity with the potential on the free layer side of the spin valve structure higher than the potential on the pinned layer side thereof.

As a result of a configuration with the above characteristics, there is the advantage that the temperature of the magnetic change layer positioned on the pinned layer side rises, so that precession movement of the free layer is facilitated. In particular, this advantageous result is prominent in an element in which a current-constricting structure is formed on the free layer side.

Further, a magnetic memory element driving method of this invention further comprises a step of reading information recorded in advance prior to applying the single-polarity electric pulse, and in the recording step, an electric pulse can be applied only when the information read in the read step is to be modified.

As a result of a configuration with the above characteristics, an electric pulse is applied only when recorded information is modified, so that power consumption can be reduced.

Further, a magnetic memory element driving method of this invention further comprises a step of applying a single-polarity electric pulse of positive polarity from the pinned layer side, and causing the magnetization alignment of the free layer magnetization and the pinned layer magnetization to be antiparallel, and a step of applying a single-polarity electric pulse of positive polarity from the pinned layer side, and causing the magnetization alignment to be parallel; the current quantity $I_{AP}$ which is the current value of the single-polarity electric pulse making the magnetization alignment antiparallel, and the current quantity $I_P$ which is the current value of the single-polarity electric pulse making the magnetization alignment parallel, can satisfy the relation $I_{AP} > I_P$. On the other hand, conversely, when in the magnetic memory element the in-plane magnetization component of the magnetic change layer is antiparallel to the pinned layer magnetization direction, the relation $I_{AP} < I_P$ should be satisfied.

By means of each of the above driving methods, single-polarity electric pulses can be used to cause the magnetization alignment to be antiparallel or parallel by the current-induced magnetization switching method, and the free layer magnetization can be switched to be parallel and antiparallel with the pinned layer magnetization by means of the spin precession method.

In the former case, a step, after the step of making the magnetization alignment parallel, of applying an electric pulse with the same polarity as the single-polarity pulse with a current quantity of $I_P$ or less, can further be included. Similarly in the latte case, this step can be a step of applying an electric pulse with the same polarity as the single-polarity pulse with a current quantity of $I_{AP}$ or less.

By means of either of these driving methods, even when variation occurs in the magnetization reversal period due to the spin precession of each element arising from variation in the element shape, and after application of a single-polarity electric pulse the magnetization alignment does not become perfectly parallel, the magnetization direction can be corrected to result in perfectly parallel alignment. By this means, the resistance value of the low-resistance state corresponding to the parallel stage is sufficiently low, so that an adequate margin during information reading is secured, and highly reliable read operations are possible.

A nonvolatile storage device of this invention is characterized by comprising a magnetic memory element, and a rectifying element connected in series to the magnetic memory element, as well as comprising information write means for performing writing and erasing by means of the driving method as described in any of Claims 10 through 19, and means for reading the recorded information from a quantity of electricity (namely, electric current or voltage) flowing in the magnetic memory element.

As a result of a nonvolatile storage device with the above characteristics, switching by means of a single-polarity electric pulse becomes possible, so that a memory cell comprising a single diode and a single MTJ can be configured, and a cell area of 4 $F^2$, comparable with that of flash memory, can be achieved. Hence nonvolatile storage devices with fast operation and high overwrite cycle performance can be integrated densely on a substrate, so that high-performance nonvolatile storage device can be provided at low cost.

As explained above, a nonvolatile storage device comprising a magnetic memory element and driving method of embodiments of this invention enables switching using single-polarity electric pulses, so that a 4 $F^2$ size memory cell can be configured from one diode and one MTJ. Further, the magnetic memory element and driving method of embodiments of this invention have the advantageous result of improving the reliability of stored information read operations. By this means, a nonvolatile storage device can be realized at low cost and with high performance and high integration levels.

DESCRIPTION OF THE PREFERRED EMBODIMENTS

Figure 1:
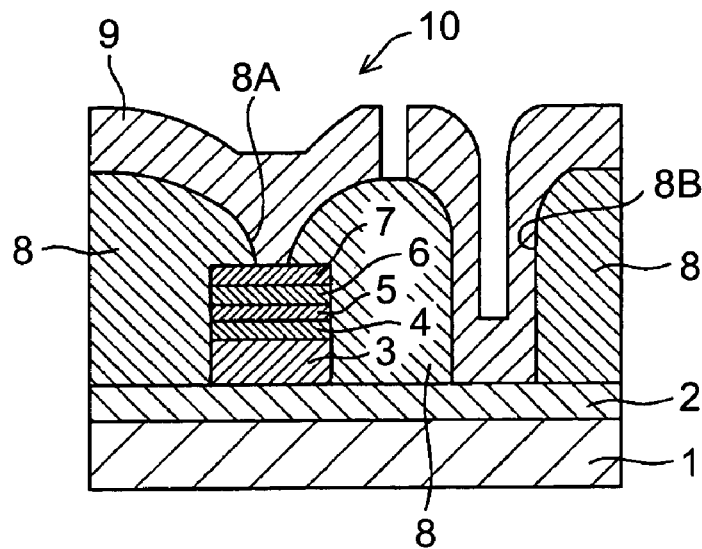
FIG. 1 is a cross-sectional view of a magnetic memory element of an embodiment of the invention.

Below, embodiments of a magnetic memory element, driving method for such an element, and a nonvolatile storage device of this invention are explained based on the drawings.

First Embodiment

A first embodiment of a magnetic memory element, a driving method for such an element, and a nonvolatile storage device of this invention is explained based on FIG. 1 through FIG. 6.

As explained above, a current-induced magnetization switching method is a method which reverses the magnetization of a free layer by means of the polarity of a current (current direction). An operation to cause the magnetizations of both the free layer and a pinned layer to be parallel is realized by passing current from the free layer side, that is, by injecting spin-polarized electrons into the free layer from the pinned layer side via the nonmagnetic layer. Conversely, an operation to cause the magnetizations to be antiparallel is realized by passing current from the pinned layer side, that is, by injecting spin-polarized electrons into the pinned layer side from the free layer side via the nonmagnetic layer. In this case of this operation to cause the magnetizations to be antiparallel, only electrons having spin parallel to the magnetization of the pinned layer pass through the nonmagnetic layer, and electrons having spin not parallel with the pinned layer magnetization are reflected and accumulate in the free layer, as a result of which, it is thought, the magnetization of the free layer is aligned to be antiparallel to the pinned layer. That is, in this method electrons are injected so that angular momentum, including localized spin, is conserved.

On the other hand, the magnetization of the free layer can be rotated independently of the spin angular momentum of the pinned layer; this is called the spin precession method. When this method is used, electric pulses may have a single polarity, so that instead of a transistor, a rectifying element (diode element) can be utilized as the selection switch necessary when forming a magnetic memory element. Hence the cell size becomes 4 $F^2$, and in principle a cross-point type memory with the minimum cell size can be realized. However, in order to excite spin precession using only a current, a comparatively large current is required, and application to a magnetic memory element which requires a tunnel insulating film is not possible.

The inventors of this application again studied the principle of spin precession. According to these studies, the interval in which the in-plane magnetization of the free layer film undergoes precession movement is the interval in which the magnetization has a component in the direction of hard magnetization, which is the direction perpendicular to the film plane, that is, the interval in which the magnetization has a component which is rising upward (erect) from a film plane direction, and this precession movement is movement about an axis perpendicular to the film plane. And, during switching by application of an electric pulse, if the free layer magnetization can be directed in the direction perpendicular to the film plane, then such precession movement can be induced by the electric pulse. In this way, it was discovered that switching is possible by the spin precession method using a single-polarity pulse.

Hence the inventors of this application further studied how to cause the magnetization to rise up to the perpendicular direction. And, as one such method, it was discovered that thermal fluctuations can be utilized. That is, the fact that, if an electric pulse is applied over an extremely short time, causing the free layer temperature to rise, then the in-plane magnetization fluctuates into the direction perpendicular to the film plane as well, can be utilized. In order to use this method, more specifically, an electric signal application method can be employed in which an electric signal pulse having large amplitude over a short period during the rising of the pulse is first applied in order to raise the temperature, and then, an electric signal pulse having the amplitude and interval necessary to excite precession movement is applied.

As a separate characteristic, it is preferable that a current-constricting structure, which causes the free layer temperature to rise still more efficiently, be provided. More specifically, the contact hole to the free layer side can be formed to be narrower than on the pinned layer side. By means of this constricting structure, current is caused to concentrate near the constricted region, and the area in which heat is generated can be concentrated.

Next, a method separate from that of thermal fluctuations, that is, a method in which a magnetic field is applied to the free layer in the direction perpendicular to the film plane during switching, is explained, referring to the figures. FIG. 1 is a cross-sectional view of the magnetic memory element 10 of this embodiment. Showing the materials and configuration of each layer in parentheses, on a substrate 1 are formed, in order, a lower electrode 2 (Cu/Ta), a pinned layer 3 (CoFeB/Ru/CoFe/PtMn), a tunnel insulating film (MgO) as a nonmagnetic layer 4 (first nonmagnetic layer), a free layer 5 (CoFeB), a nonmagnetic metal layer 6 (second nonmagnetic layer) (Pt), and a magnetic change layer 7 (TbFeCo). Next, Ar ion milling or another method is used to perform machining such that a junction size of 100×100 nm is obtained, and on this an interlayer insulating film 8 ($SiO_2$) is formed. Then, after patterning openings to become a contact hole 8A for a joining portion and a contact hole 8B for the lower electrode, the upper electrode 9 (Cu/Ta) is formed on the interlayer insulating film 8, and patterning is performed. Electric pulses are used to cause temperature changes in the magnetic change layer 7.

As this magnetic change layer 7, as described above, TbFeCo or another N-type ferrimagnetic material is preferable. An N-type ferrimagnetic material is a material in which there exist two types of antiparallel magnetizations A and B, and for which, because their temperature dependences are different, there exists a magnetic compensation temperature $T_{comp}$ at which the apparent magnetization (A-B) vanishes; in actuality, the above-described TbFeCo has two types of distinguishable magnetizations, which are the magnetization of the Tb and the magnetization of the FeCo, and the temperature dependences of each are different. Hence on the high-temperature side and the low-temperature side with the magnetic compensation temperature $T_{comp}$ as the boundary, the sign of the apparent magnetization (A-B) for the entirety of the magnetic change layer 7 can be reversed. Even when such a material is adopted as the magnetic change layer 7, two further operations can be considered. This is explained further using FIG. 2 and FIG. 3.

Figure 2:
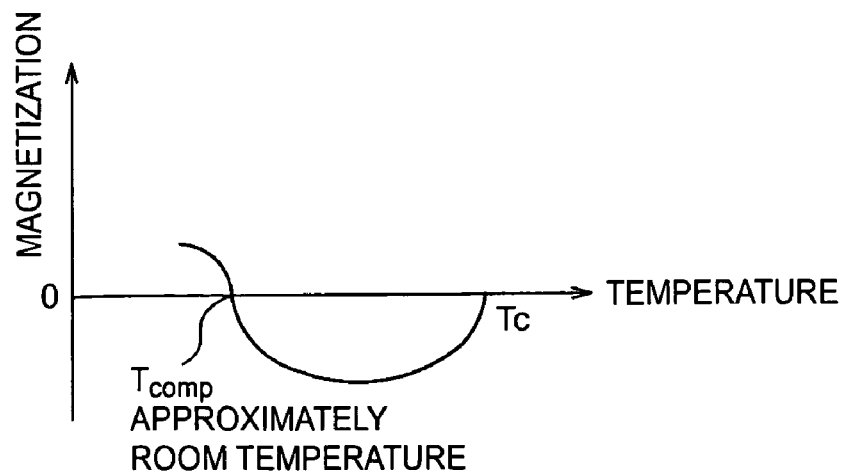
FIG. 2 schematically shows the relation between magnetization of a magnetic change layer and temperature, when used as the magnetic change layer comprised by the magnetic memory element of an embodiment of the invention.
Figure 3:
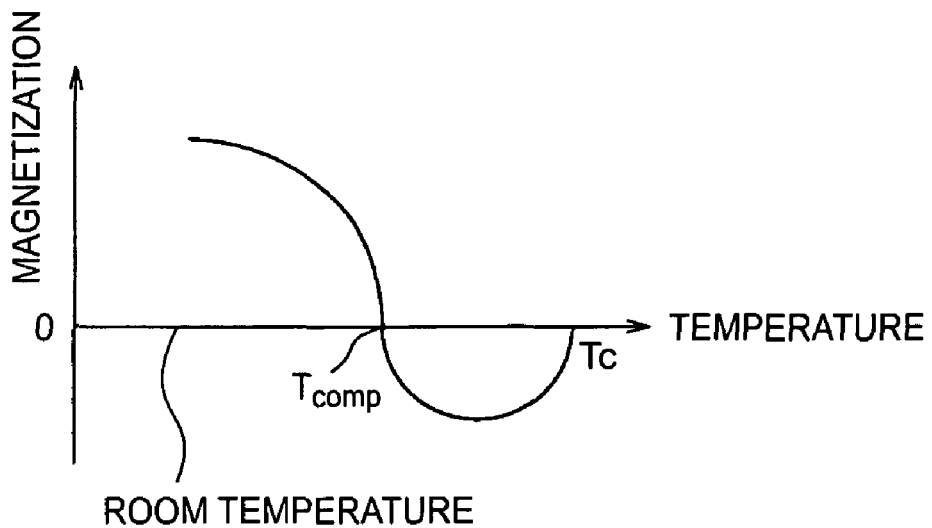
FIG. 3 schematically shows the relation between magnetization and temperature, when used as the magnetic change layer comprised by the magnetic memory element of an embodiment of the invention.

FIG. 2 and FIG. 3 are characteristic diagrams showing the temperature change in the magnetization of magnetic change layers of this embodiment; FIG. 2 shows the relation between temperature and the magnetization of an N-type ferrimagnetic material exhibiting a magnetic compensation temperature near room temperature, and FIG. 3 shows a case in which the magnetic compensation temperature is near room temperature. In FIGS. 2 and 3, Tc designates the Curie temperature. In this embodiment, as shown in FIG. 2, it is preferable that the magnetic compensation temperature be higher than room temperature. In this case, initially there is no magnetic flux leaking from the magnetic change layer 7 in normal operation (or the leaking magnetic flux is weak), so that the magnetization of the free layer 5 is not affected by the magnetic change layer 7. And, when an electric pulse is applied to raise the temperature, the current due to this pulse causes the temperature of the magnetic change layer 7 to rise, and this rise in temperature is accompanied by leaking of magnetic flux from the magnetic change layer. At this time, by causing the magnetic flux to be directed in the direction perpendicular to the film plane, the magnetization of the free layer which is affected fluctuates in the perpendicular direction. As a result, when an electric pulse to raise the temperature is applied, spin precession becomes possible. Rare earth-transition metal amorphous alloys are materials which are suitable for magnetic change layers with a structure suitable for such switching operation between normal operation and spin precession operation. The above-described TbFeCo is one rare earth-transition metal amorphous alloy, and by adjusting the alloy compensation, can be designed such that the magnetic compensation temperature is close to room temperature, while remaining a perpendicular magnetization film magnetized in the perpendicular direction.

In this embodiment, as shown in FIG. 3, it is preferable that an N-type ferrimagnetic material with a magnetic compensation temperature at room temperature or above be used. This is because magnetic flux in the direction perpendicular to the film plane occurring at room temperature, that is, at or below the magnetic compensation temperature, is reversed when the temperature of the magnetic change layer 7 rises to the magnetic compensation temperature or higher due to application of an electric pulse, so that fluctuations in the direction perpendicular to the film plane of the free layer magnetization can be made still larger.

Figure 4:
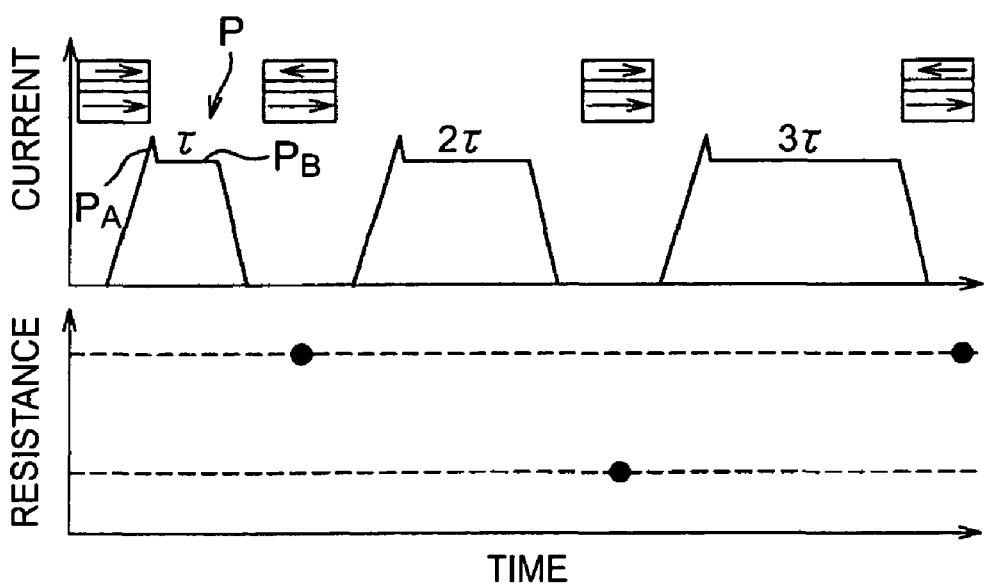
FIG. 4 is an explanatory diagram showing a magnetic memory element driving method of an embodiment of the invention.

Next, based on the above principles, a method of driving a magnetic memory element of this invention is explained. FIG. 4 shows a method of driving a magnetic memory element of this invention, which is a method of recording information using pulse widths. In the top portion of the figure, voltage pulses P with pulse widths $\tau$, $2\tau$, $3\tau$ are shown. As shown in FIG. 4, in this embodiment information is recorded using pulse widths; the upper portion in FIG. 4 shows voltage pulses with pulse widths of $\tau$, $2\tau$, $3\tau$, and the bottom portion of FIG. 4 shows element resistance values after application of the voltage pulses with pulse widths of $\tau$, $2\tau$, $3\tau$ from an initial state. The high-resistance state is the state in which the magnetizations in the magnetic memory element are antiparallel, and the low-resistance state corresponds to the parallel state. Here, $\tau$ is the period necessary for a 180° rotation of the free layer magnetization due to spin precession. The amplitude (voltage) at the pulse rising edge $P_A$ is set to be larger than the average amplitude value including the entire voltage $P_B$ of the pulse which follows. This is because, initially when the pulse P is applied, thermal fluctuations induce precession, and the temperature of the magnetic change layer is caused to rise so that the perpendicular magnetic flux due to the magnetic change layer is also reversed, so that precession is more easily induced. In the lower portion of FIG. 4, element resistance values are shown after applying a voltage pulse P with pulse width of $\tau$, $2\tau$, $3\tau$ from the initial state (parallel state). By applying a voltage pulse having a pulse width which is an odd multiple of $\tau$, the antiparallel state, that is, the high-resistance state results, and when a voltage pulse having a pulse width which is an even multiple of $\tau$ is applied, rotation is through 360°, so that the initial state is maintained. The magnetizations in the magnetic memory element are in the antiparallel state, and the low-resistance state corresponds to the parallel state. To repeat, reversal of the free layer magnetization is possible by applying a single-polarity voltage pulse, as shown.

Figure 5:
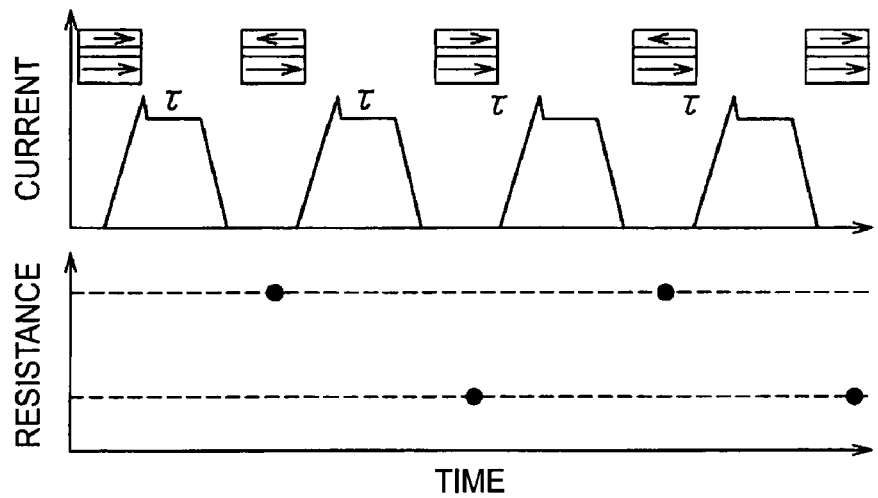
FIG. 5 is an explanatory diagram showing a magnetic memory element driving method of an embodiment of the invention.

Further, as shown in FIG. 5, information can be recorded through the number of pulses having pulse width $\tau$. In this embodiment, information can be recorded through the number of pulses; the upper portion of FIG. 5 shows voltage pulses with pulse width $\tau$, and the lower portion of FIG. 5 shows the resistance values of an element after application of 1, 2, 3, and 4 voltage pulses in sequence with pulse width $\tau$ from an initial state. The upper portion shows four voltage pulses with pulse width $\tau$. In this way, in a magnetic memory element of this embodiment, operation is possible so that upon application of each pulse the state is switched to the antiparallel (high-resistance) and to the parallel (low-resistance) state.

Figure 6:
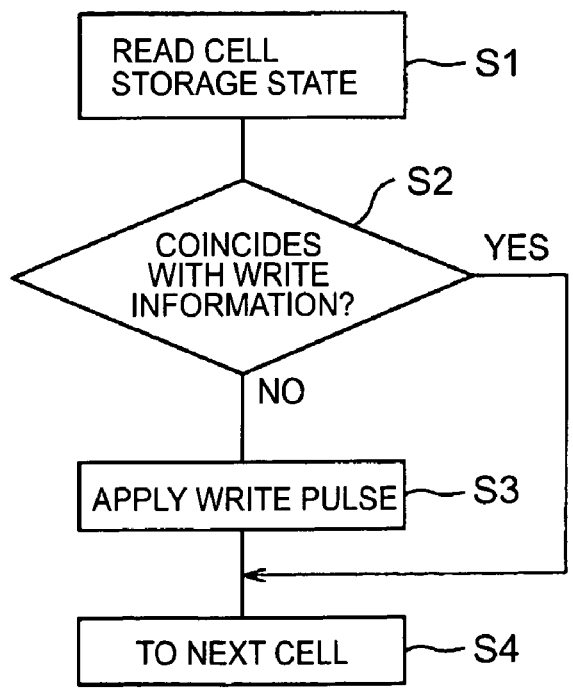
FIG. 6 is a flowchart showing an example of the magnetic memory element driving method of an embodiment of the invention.

As explained above, in the spin precession method, toggle switching results, so that when there is no need to overwrite information, there is no need to apply a voltage pulse. FIG. 6 is a flowchart presenting this processing in a simple form.

First, the cell storage state is read (step S1), and whether the information coincides with the write information is checked (step S2). If the information coincides with the write information, processing advances to write processing for the next cell, without applying an electric pulse (step S4). If the information does not coincide with the write information, an electric pulse is applied, and information overwriting is completed (step S3), after which processing advances to write processing for the next cell (step S4).

As explained above, by means of a magnetic memory element and a method of driving such an element of this invention, free layer magnetization reversal is possible using single-polarity electric pulses, and switching can be performed.

Second Embodiment

Figure 7:
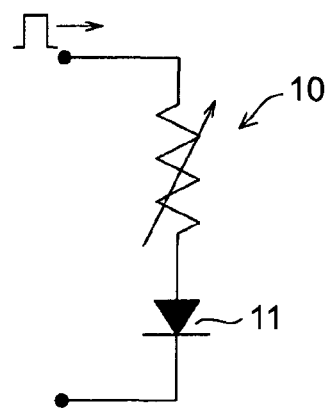
FIG. 7 schematically shows the configuration of a practical example of the nonvolatile storage device of an embodiment of the invention.

Next, an example of the configuration of a nonvolatile storage device using elements of this invention as memory cells is explained using FIG. 7.

FIG. 7 schematically shows a magnetic memory element and a rectifying element forming part of a cross-point type memory cell array, which is one practical example of a nonvolatile storage device of this embodiment; the magnetic memory element 10 and rectifying element 11 forming part of the cross-point type memory cell array, which is a practical example of a nonvolatile storage device of the invention are shown schematically. As already explained, by means of a magnetic memory element 10 and a driving method for such an element of this invention, switching is possible using single-polarity electric pulses. As the selection switch for this element, a rectifying element 11 (here, an example of a diode is shown) is connected in series; the upper electrode and lower electrode are formed on respective stripes, and the directions of the upper electrode and lower electrode are directed intersecting in mutually different planes, and memory is formed near the points of these intersections, to form array-shape cross-point type memory. For example, diodes can be formed in advance on a silicon substrate, and the magnetic memory elements of this invention can be formed on the upper portion thereof. By applying electric pulses as shown in FIG. 1 from the free layer side, the temperature of the magnetic change layer can be raised efficiently.

Further, the maximum value of process temperatures necessary for manufacture of a magnetic memory element of this invention is an annealing temperature of approximately 350° C., so that there is no damage to the performance of the transistors to supply electric pulses or to the diodes for cell selection and switching formed therebelow. Also, wiring can withstand the above annealing temperature, and so this combination can be layered in three dimensions to increase memory capacity.

Third Embodiment

Figure 8A:
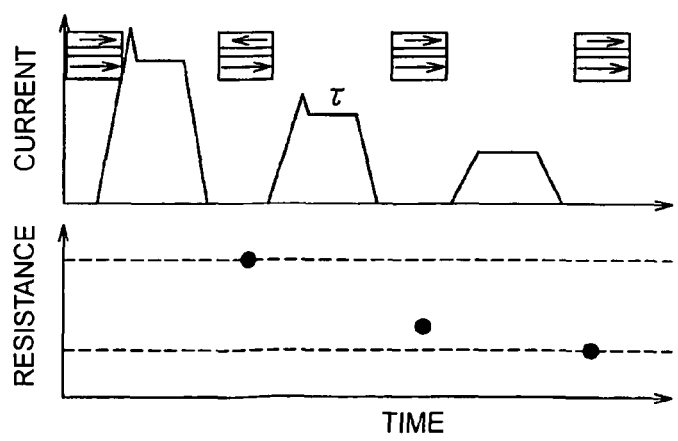
FIG. 8 schematically shows the magnetic memory element driving method of an embodiment of the invention, in which current-induced magnetization switching is used to make the magnetization alignment antiparallel, and spin precession is used to make the magnetization alignment parallel, wherein the current polarity direction is expressed by the rectifying element connected in series.
Figure 8B:
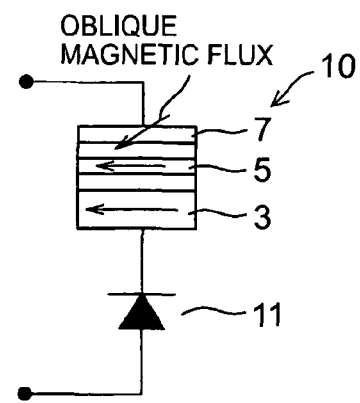

Still another embodiment of this invention is an element and a method of driving the element, explained based on FIG. 8 and FIG. 9. FIG. 8 schematically shows a method of driving a magnetic memory element of this embodiment, which is a method in which the magnetization alignment is made antiparallel by current-induced magnetization switching, and is made parallel by spin precession (FIG. 8a). Further, the current polarity direction is expressed by the rectifying element connected in series (FIG. 8b). Also, FIG. 9 shows a method of driving a magnetic memory element of this embodiment, schematically showing operation in which the magnetization alignment is made parallel by current-induced magnetization switching, and is made antiparallel by spin precession.

This embodiment was obtained by the inventors of this application, in order to realize switching using single-polarity voltage pulses, by combining the different switching principles of current-induced magnetization switching and spin precession. To study the principles concerned, first, whether such a combination can be realized is studied. This begins with a study of the kinds of conditions to be satisfied in order to realize the desired operation by means of the above combinations.

In the studies of the inventors of this application, whether a manufactured element operated as intended (possibility of operation) depends on whether $I_{sp}<I_{stt}$ can be realized. Here, the spin precession threshold current is $I_{sp}$, and the current-induced magnetization switching threshold current is $I_{stt}$. In order to use current-induced magnetization switching in an operation to cause the free layer magnetization to be antiparallel to, or parallel to, the pinned layer magnetization, cases to be studied can be arranged by taking into consideration the fact that an element can be manufactured such that the current application direction can be from each of the pinned layer side and from the free layer side, as well as the fact that, so long as current-induced magnetization switching does not occur, whether a current is applied from the pinned layer side or from the free layer side, free layer magnetization reversal is possible by means of spin precession. As a result, it is sufficient to study the possibility of operation for each of the following two cases. These are, (1) the case in which antiparallel alignment is realized through current-induced magnetization switching, and (2) the case in which parallel alignment is realized through current-induced magnetization switching. In the case of (1) realization of antiparallel alignment through current-induced magnetization switching, transition from antiparallel alignment to parallel alignment is caused through spin precession. Conversely, in the case of (2) realization of parallel alignment through current-induced magnetization switching, transition from parallel alignment to antiparallel alignment is caused through spin precession.

In the case of (1) realization of antiparallel alignment through current-induced magnetization switching, by satisfying $I_{sp}<I_{stt}$, that is, $I_P<I_{AP}$, spin precession and current-induced magnetization switching can be combined to enable operation. This is because, from the conditions by which the spin precession current does not cause current-induced magnetization switching, $I_{sp}<I_{stt}$ is derived, but $I_{sp}$ and $I_{stt}$ are the currents to realize parallel alignment and antiparallel alignment respectively. Here, $I_P$ represents current when the alignment is parallel and $I_{AP}$ represents current when the alignment is antiparallel. Similarly in the case of (2) realization of parallel alignment through current-induced magnetization switching, by satisfying $I_{sp}<I_{stt}$, that is, $I_P>I_{AP}$, spin precession and current-induced magnetization switching can be combined to enable operation. In general, an element structure satisfying $I_{sp}<I_{stt}$ can always be manufactured.

And, a magnetic field in the direction perpendicular to the film plane is necessary to excite spin precession; this magnetic field is realized by providing the magnetic change layer with properties such that the magnetization increases according to temperature, and moreover the magnetization direction becomes oblique to the film plane. Hence in this embodiment, the property of the magnetic change layer that the magnetic field becomes oblique is used. Here the structure of the magnetic memory element is similar to that of Embodiment 1 shown in FIG. 1, but the magnetic change layer 7 is manufactured from GdFeCo. Therefore, the magnetization of the magnetic change layer 7, which is an N-type ferrimagnetic material, comprises two types, which are the magnetization of Gd including two types of antiparallel magnetization, and the magnetization of FeCo. Because the temperature dependences of magnetizations of Gd and FeCo differ respectively, the material has the physical property by which there exists a magnetic compensation temperature $T_{comp}$ at which the apparent magnetization (A-B) vanishes. The Gd used in this embodiment has the largest magnetic moment among the rare earth elements, so that the demagnetizing field is also large. Hence near the Curie point, until the magnetization becomes small, the magnetization is in-plane, and as the temperature rises a perpendicular magnetization component appears, so that consequently the magnetization direction becomes oblique to the film plane.

Next, the role of the in-plane magnetization component of this magnetic change layer is explained. Because there is variation in machining of the element shape, in case (1) above there is variation among elements in the time for switching to the parallel alignment through spin precession. Here, τ is the time required for the free layer magnetization to rotate through 180° due to spin precession. That is, when an electric pulse of pulse width τ is applied and switching to parallel alignment is performed by spin precession, the optimum value of τ will vary among elements, to that if signals with the same pulse width are used for all elements, perfect parallel alignment will not result, and there will be elements in which some deviation will occur. As a result, there is the problem that the margin for reading stored information is reduced.

Here, when the in-plane magnetization of the magnetic change layer is parallel to the pinned layer magnetization alignment, by applying an electric pulse resulting in a current at or below the threshold current $I_{sp}$ to excite spin precession, and generating leakage magnetic flux from the in-plane magnetization of the magnetic change layer, the free layer magnetization alignment, which had deviated from parallel alignment, can be made completely parallel. That is, the problem of reduced read margin arising from the shifts in the spi precession period τ due to variation in machining between elements as described above can be resolved, and highly reliable read operations are made possible. This is shown in FIG. 8.

FIG. 8(a) is an explanatory diagram explaining the above principle of operation. Here, notation is such that current supplied from the pinned layer side is positive. The series connection with the rectifying element is shown in FIG. 8(b) to clearly indicate this situation; the configuration is the same as that of a memory element 10 used in one memory cell when actually configuring cross-point type memory, so that in this embodiment also a nonvolatile storage device can be realized. By using the electric pulse P1 to supply a current equal to or greater than the current-induced magnetization switching threshold current $I_{STT}=I_{AP}$, switching to a completely antiparallel alignment, that is, to the high-resistance state, is accomplished. Next, in order to obtain parallel alignment, an electric pulse P2 having the same polarity and pulse width τ is applied, resulting in a current $I_{sp}=I_P<I_{AP}$. By this means, the free layer magnetization is switched to parallel alignment, that is, to the low-resistance state. At this time, because of the variation between elements described above, there are some elements in which alignment is not completely parallel. Next, a current smaller than $I_{sp}=I_P$ is supplied by means of the electric pulse P3, to cause an in-plane magnetization component of the magnetic change layer. The in-plane magnetization component at this time is parallel to the pinned layer magnetization, so that through the leakage magnetic flux, the free layer magnetization can be put into completely parallel alignment.

Figure 9A:
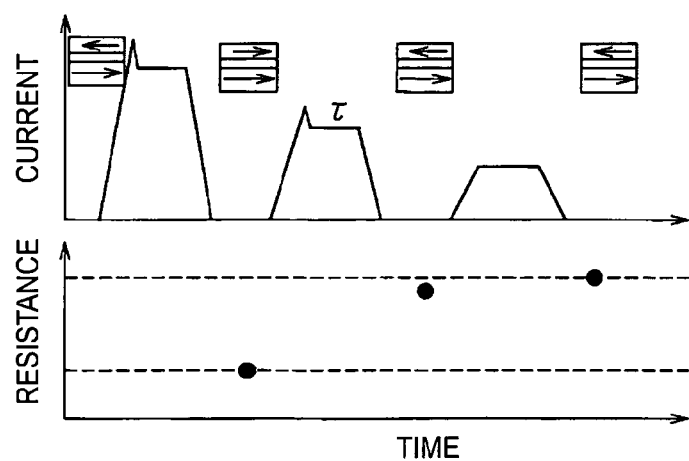
FIG. 9 schematically shows the magnetic memory element driving method of an embodiment of the invention, in which current-induced magnetization switching is used to make the magnetization alignment parallel, and spin precession is used to make the magnetization alignment antiparallel, wherein the current polarity direction is expressed by the rectifying element connected in series.
Figure 9B:
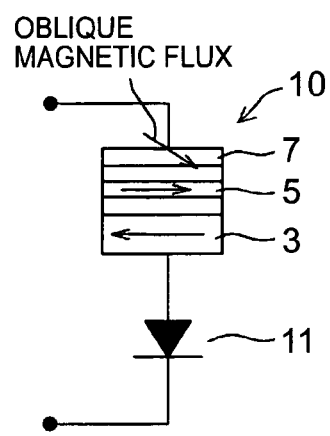

In the case of (2) above, the process is completely opposite. This is shown in FIG. 9. Differences with the case of (1) above are, as shown in FIG. 9(a), parallel alignment is realized by a pulse current P1 to cause current-induced magnetization switching, and conversely, antiparallel alignment is realized by a pulse current P2 to cause spin precession, and in order to realize these, the currents are opposite, as shown in FIG. 9(b). Otherwise the operation corresponds to the operation for the case (1) described above. By means of this configuration, a completely antiparallel alignment state is also possible through spin precession, so that the problem of a reduced margin for reading the high-resistance state can be resolved.

As explained in the above embodiments, by means of a magnetic memory element and a driving method for such an element of this invention, reversal of the free layer magnetization is possible even when using single-polarity electric pulses. Hence even in a configuration using two-terminal elements to generate single-polarity electric pulses, a memory element in which appropriate writing is possible, and a storage device having such memory elements, can be realized.

In the above, embodiments of the invention have been explained; but the invention is not limited to the aforementioned embodiments, and various modifications, alterations, and combinations are possible based on the technical concepts of the invention. Further, the materials and methods of formation given as examples in the embodiments of examples of configurations of elements of the invention are not limited to those of the above embodiments.

The invention claimed is:

1. A magnetic memory element having a spin valve structure, comprising:
   a free layer having a thickness defined by a first face and a second face and exhibiting ferromagnetism;
   a first nonmagnetic layer positioned at the first face;
   a pinned layer exhibiting ferromagnetism, and in which the spin valve structure is caused to store information by applying an electric pulse, the first magnetic layer being sandwiched between the pinned layer and the free layer;
   a second nonmagnetic layer positioned at the second face of the free layer; and
   a magnetic change layer comprising a magnetic material having magnetic characteristics which change according to temperature, the second nonmagnetic layer being sandwiched between the magnetic change layer and the free layer.

2. The magnetic memory element according to claim 1, wherein the magnetic material of the magnetic change layer has at least one of first and second magnetic characteristics, the first magnetic characteristics being that an apparent value is inverted on a low-temperature side and on a high-temperature side with a predetermined temperature as a boundary between the low-temperature and high-temperature sides, and the second magnetic characteristic being that magnetic properties are expressed in only one of the low-temperature side and the high-temperature side.

3. The magnetic memory element according to claim 2, wherein the first and second nonmagnetic layers have respective resistance values, the resistance value of the second nonmagnetic layer being greater than the resistance value of the first nonmagnetic layer.

4. The magnetic memory element according to claim 2, wherein the predetermined temperature is a magnetic compensation temperature $T_{comp}$ that is within an operation temperature range for operation of the magnetic memory element, and the magnetic change layer comprises an N-type ferrimagnetic layer, which exhibits magnetization in a direction perpendicular to a layering face of the spin valve structure on the high-temperature side of the magnetic compensation temperature $T_{comp}$.

5. The magnetic memory element according to claim 2, wherein the predetermined temperature is a magnetic compensation temperature $T_{comp}$ that is a temperature higher than an operation temperature range for operation of the magnetic memory element, and the magnetic change layer comprises an N-type ferrimagnetic layer, which exhibits magnetization in opposite directions on the low-temperature side and on the high-temperature side of the magnetic compensation temperature $T_{comp}$.

6. The magnetic memory element according to claim 2, further comprising a current-constricting structure which limits the region of passage of a current flowing in the free layer.

7. The magnetic memory element according to claim 1, wherein the magnetic change layer comprises a magnetic material a magnetization of which increases, and the magnetization direction of which becomes oblique according to the temperature.

8. The magnetic memory element according to claim 7, wherein an in-plane component of the magnetization of the magnetic change layer is parallel to a magnetization direction of the pinned layer.

9. The magnetic memory element according to claim 7, wherein an in-plane component of the magnetization of the magnetic change layer is antiparallel to a magnetization direction of the pinned layer.

10. A nonvolatile storage device, comprising:
    the magnetic memory element according to claim 1; and
    a rectifying element, connected in series to the magnetic memory element,
    wherein a single-polarity pulse to the spin valve structure to perform writing in the spin valve structure, and
    wherein information that has been written in the spin valve structure is read by detecting from a quantity of electricity flowing in the magnetic memory element.

11. A method of driving a magnetic memory element that has a spin valve structure and that includes a free layer having a thickness defined by a first face and a second face and exhibiting ferromagnetism, a first nonmagnetic layer positioned at the first face, and a pinned layer that exhibits ferromagnetism, the first nonmagnetic layer being sandwiched between the pinned layer and the free layer, the magnetic memory element further including a second nonmagnetic layer positioned at the second face of the free layer, and a magnetic change layer having magnetic characteristics of which change according to temperature, the second nonmagnetic layer being sandwiched between the magnetic change layer and the free layer, the method comprising the step of:
    applying a single-polarity electric pulse to the spin valve structure to record information in the spin valve structure.

12. The method of driving a magnetic memory element according to claim 11, further comprising the step of making an amplitude of the single-polarity electric pulse in a rising interval greater than an averaged value across an entire pulse width of the amplitude of the single-polarity electric pulse.

13. The method of driving a magnetic memory element according to claim 11, further comprising the step of controlling the pulse width of the single-polarity electric pulse, wherein the single-polarity electric pulse having a controlled pulse width is used to control a magnetization of the free layer of a spin valve element, and the information is recorded as a combination of directions of the magnetization of the free layer and the magnetization of the pinned layer.

14. The method of driving a magnetic memory element according to claim 12, further comprising the step of controlling a number of the single-polarity electric pulses, wherein the number of single-polarity electric pulses having a controlled pulse width is used to control the magnetization of the free layer of a spin valve element, and information is recorded as a combination of directions of the magnetization of the free layer and the magnetization of the pinned layer.

15. The method of driving a magnetic memory element according to claim 11, wherein the single-polarity electric pulse has a polarity such that a potential on a free layer side of the spin valve structure is higher than the potential on the pinned layer side thereof.

16. The method of driving a magnetic memory element according to claim 11, further comprising the step of reading information recorded in advance prior to applying the single-polarity electric pulse, wherein in the step of applying a single polarity electric pulse, an electric pulse is applied only when the information read in the reading step is to be modified.

17. A method of driving the magnetic memory element that has a spin valve structure and that includes a free layer having a thickness defined by a first face and a second face and exhibiting ferromagnetism; a first nonmagnetic layer positioned at the first face; a pinned layer exhibiting ferromagnetism, and in which the spin valve structure is caused to store information by applying an electric pulse, the first magnetic layer being sandwiched between the pinned layer and the free layer; a second nonmagnetic layer positioned at the second face of the free layer; and a magnetic change layer comprising a magnetic material having magnetic characteristics which change according to temperature, the second nonmagnetic layer being sandwiched between the magnetic change layer and the free layer, the magnetic change layer including a magnetic material a magnetization of which increases, and the magnetization direction of which becomes oblique according to the temperature, an in-plane component of the magnetization of the magnetic change layer being parallel to a magnetization direction of the pinned layer, said method comprising the step of:

applying either a single-polarity electric pulse of positive polarity from a pinned layer side to cause a magnetization alignment of the free layer magnetization and the pinned layer magnetization to be antiparallel, or a single-polarity electric pulse of positive polarity from a pinned layer side to cause the magnetization alignment to be parallel, wherein a current quantity $I_{AP}$, which is a current value of the single-polarity electric pulse making the magnetization alignment antiparallel, and a current quantity $I_P$, which is the current value of the single-polarity electric pulse making the magnetization alignment parallel, satisfy a relation $I_{AP} > I_P$.

18. The method of driving a magnetic memory element according to claim 17, further comprising the step, after the step of making the magnetization alignment parallel, of applying an electric pulse of the same polarity as the single-polarity pulse with a current quantity of $I_P$ or less.

19. A method of driving the magnetic memory element that has a spin valve structure and that includes a free layer having a thickness defined by a first face and a second face and exhibiting ferromagnetism; a first nonmagnetic layer positioned at the first face; a pinned layer exhibiting ferromagnetism, and in which the spin valve structure is caused to store information by applying an electric pulse, the first magnetic layer being sandwiched between the pinned layer and the free layer; a second nonmagnetic layer positioned at the second face of the free layer; and a magnetic change layer comprising a magnetic material having magnetic characteristics which change according to temperature, the second nonmagnetic layer being sandwiched between the magnetic change layer and the free layer, the magnetic change layer including a magnetic material a magnetization of which increases, and the magnetization direction of which becomes oblique according to the temperature, an in-plane component of the magnetization of the magnetic change layer being parallel to a magnetization direction of the pinned layer, said method comprising the step of:

applying either a single-polarity electric pulse of positive polarity from a free layer side to cause a magnetization alignment of the free layer magnetization and the pinned layer magnetization to be antiparallel, or a single-polarity electric pulse of positive polarity from a free layer side to cause the magnetization alignment to be parallel, wherein a current quantity $I_{AP}$, which is the current value of the single-polarity electric pulse making the magnetization alignment antiparallel, and a current quantity $I_P$, which is the current value of the single-polarity electric pulse making the magnetization alignment parallel, satisfy the relation $I_{AP} < I_P$.

20. The method of driving a magnetic memory element according to claim 19, further comprising the step, after the step of making the magnetization alignment parallel, of applying an electric pulse of the same polarity as the single-polarity pulse with a current quantity of $I_{AP}$ or less.

* * * * *